United States Patent [19]
Yu

[11] 4,229,714
[45] Oct. 21, 1980

[54] RF CONNECTOR ASSEMBLY WITH PROVISION FOR LOW FREQUENCY ISOLATION AND RFI REDUCTION

[75] Inventor: John P. Yu, Indianapolis, Ind.
[73] Assignee: RCA Corporation, New York, N.Y.
[21] Appl. No.: 969,780
[22] Filed: Dec. 15, 1978
[51] Int. Cl.² .............. H03H 7/04; H03H 7/14; H04B 3/28
[52] U.S. Cl. .............. 333/12; 333/24 C; 333/177; 333/181; 333/182
[58] Field of Search .......... 333/24 R, 24 C, 181–182, 333/184–185, 206–207, 177–180, 25–26, 254, 260, 12; 336/229; 339/143 R, 147 R, 147 C; 361/301–303, 306, 311

[56] References Cited
U.S. PATENT DOCUMENTS

| | | | |
|---|---|---|---|
| 1,869,914 | 8/1932 | Round | 333/177 X |
| 2,520,985 | 9/1950 | Williams et al. | 333/24 R X |
| 2,669,697 | 2/1954 | Olesen | 333/32 X |
| 3,299,384 | 1/1967 | Lee | 336/229 X |
| 3,617,607 | 11/1971 | Williams | 333/24 C X |
| 3,980,976 | 9/1976 | Tadama et al. | 333/181 X |

*Primary Examiner*—Marvin L. Nussbaum
*Attorney, Agent, or Firm*—E. M. Whitacre; J. S. Tripoli

[57] ABSTRACT

An RF coaxial connector assembly, having an inner and outer conductor, employs a washer-like capacitor fitted over the outer conductor for low frequency isolation and employs a transformer adapted for connection between a source of RF signals and the inner and outer conductors of the assembly for reducing the RF currents on the outer conductor. Reduction of the RF currents on the outer conductor is effective to reduce the radiation of RF energy from a coaxial cable coupling the connector assembly to the load.

7 Claims, 4 Drawing Figures

RF CONNECTOR ASSEMBLY WITH PROVISION FOR LOW FREQUENCY ISOLATION AND RFI REDUCTION

The present invention relates generally to RF connector assemblies and more particularly to an RF connector assembly having low frequency isolation and including a means for reducing radio frequency interference effects.

In a United States patent appliction filed concurrently herewith in the names of J. P. Yu and D. J. Carlson, there is described an RF connector which is useful for the coupling of RF signals from a utilization device to another device such as a TV receiver. Typically, a coaxial cable is used for the interconnection between the RF connector on the utilization device and the TV receiver. In accordance with the teachings of the aforementioned application, a washer-like capacitor is fitted over the outer conductor of the RF connector assembly. This washer-like capacitor provides a uniformly distributed capacitance between the outer conductor and a conductive wall of the utilization device to which the connector is attached. In operation, the RF connector with its distributed capacitance is effective to provide low frequency and DC isolation between the outer conductor and the utilization device. As a result of the use of such a connector, the utilization device becomes isolated from faults in the device to which the utilization device is connected. That is, if there is a fault in a device, such as a TV receiver, the connector assembly will prevent the flow of DC currents or low frequency currents over the shield of the coaxial cable connecting the two devices. Thus, if the device such as the TV receiver has a fault wherein its chassis becomes hot, the use of this form of connector assembly will reduce or eliminate the exposure to shock hazard for a user of the utilization device. In the aforementioned patent application, the utilization device is described as a video disc player. However, it is clear that the RF connector assembly described is equally useful in a wide variety of applications wherein two devices are connected together via an RF coaxial connection. For example the utilization device may be a video tape player, a video game, a video terminal or any one of a number of other devices. In each case, the concern is to isolate the utilization device from the device to which it is connected.

RF connector assemblies as described above have been found to be effective for providing DC and low frequency isolation between two devices. When two devices such as a video disc player and a television receiver are connected together, the electrical coupling is typically made via a coaxial cable. The length of the coaxial cable connecting the two devices is typically on the order of several feet in length. The RF signals being coupled from the video disc player to the TV receiver are generally at a frequency of about 60 MHz. This frequency is in the lower channels, for example, channels 2 and 3 of the VHF band. When signals at these frequencies are coupled to the receiver, almost any amount of load current flowing over the outer shield of the coaxial cable will generate an appreciable potential across a finite impedance of the washer-like capacitor with respect to system ground. In effect, the coaxial cable appears to function much like an antenna.

There are certain standards which are applied to devices which are connected to TV receivers in respect of radio frequency interference limits. One standard is such that there must be less than 15 microvolts per meter field strength measured at a one meter distance from the device connected to the television receiver. Again, with any appreciable current flowing over the shield of the coaxial cable, and therefore also over the outer conductor of the coaxial connector at the back of the utilization device, it becomes very difficult to meet these stringent RFI standards.

In accordance with the principles of the present invention, an RF coaxial connector assembly is provided which incorporates the feature of low frequency isolation as well as providing a simple, yet effective, approach to the reduction of radio frequency interference. An RF connector assembly having these desirable features has an inner conductor and an outer conductor and the assembly is adapted for coupling signals from an RF source to a load. The assembly comprises a transformer which has a primary and a secondary winding. The transformer primary winding is adapted for connection to the RF source. The transformer secondary winding is adapted for connection between the inner conductor and the outer conductor of the connector assembly. The assembly further comprises a means for providing a capacitance which is electrically connected between the primary and the secondary windings.

In one embodiment of the present invention, the primary and the secondary windings each comprise an equal number of turns wound on a common core.

In another embodiment of the present invention, the capacitance means comprises a washer-like capacitor fitted over the outer conductor of the connecter assembly.

Figure 1:
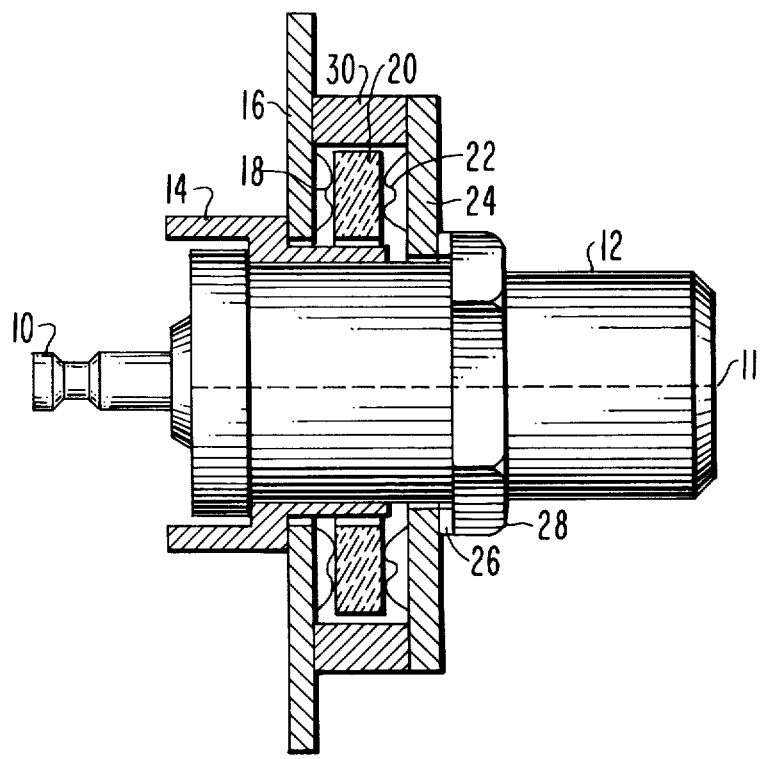
FIG. 1 is a sectional representation of an RF connector assembly having low frequency isolation.

Referring now to FIG. 1 there is shown an RF connector assembly including provision for low frequency and DC isolation. The connector assembly comprises an inner conductor 11 which is electrically connected on one side to a tab 10 and an outer conductor shown as 12. Outer conductor 12 is typically a threaded member. The assembly further comprises an insulation bushing or sleeve 14 which is adapted to receive the fixed nut portion of the outer conductor 12. Insulation bushing 14 is adapted to butt up against the metal chassis wall 16. On the other side of the chassis wall 16, the insulation bushing 14 extends along the outer conductor 12 of the RF connector assembly. In addition, on the other side of the chassis wall 16, there is located a conductive spring washer 18. Spring washer 18 provides an electrical connection between the outside of chassis wall 16 and an electrode which is deposited on one of the major flat surfaces of the washer-like ceramic capacitor 20. There is a similar spring washer 22 located on the other side of ceramic capacitor 20. There is also a capacitor electrode deposited on the other major flat surface of capacitor 20. A flat washer 24 is then fitted over the threaded portion of outer conductor 12 and brought into electrical contact with the spring washer 22. Thus, spring washer 22 provides an electrical connection between one side of capacitor 20 and the outer conductor 12 through washer 24. A lock washer 26 is then fitted over the threaded portion of outer conductor 12 and this is followed by a nut 28 which is threaded onto the outer conductor 12. The assembly is fastened to the chassis wall 16 when the nut 28 is tightened down on the threaded portion of outer conductor 12. In order to prevent damage to the ceramic capacitor 20 an insulation spacer 30 is provided. Insulation spacer 30 will receive the forces which are applied when the nut 28 is tightened down and will further provide environmental protection for the capacitor 20.

In the typical application, the inner conductor will be connected to a source of RF signals via the tab 10. On the other side of the chassis wall 16, a female coupling will be threaded onto the threaded portion of the outer conductor 12 followed by a coaxial cable which will make a connection to the load, such as a television receiver.

Figure 2:
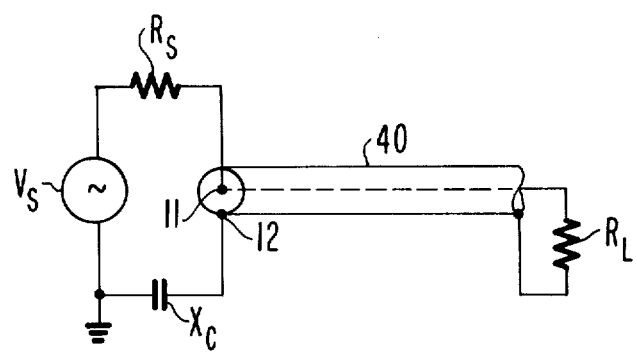
FIG. 2 is a schematic diagram representing the equivalent circuit of the assembly of FIG. 1 when a coaxial cable and a load are connected thereto.

Referring now to FIG. 2, the equivalent circuit of FIG. 1 is shown when a cable and a load are attached to the connector of FIG. 1. The source of RF signals is represented by the supply $V_s$. The internal impedance of the source is shown as $R_s$. The internal impedance $R_s$ is electrically connected to the inner conductor of the RF connector assembly. The capacitance $X_c$ which is provided by washer-like ceramic capacitor 20 is electrically connected between the outer conductor 12 of the RF connector assembly and the system ground side of the RF signal source $V_s$. FIG. 2 also shows a coaxial cable 40 connected to the RF connector assembly on one end thereof. On the other end of cable 40 there is shown the representation of the load impedance $R_L$ connected between the inner conductor of the coaxial cable 40 and the outer conductor or shield of the cable 40.

In one embodiment of the RF connector assembly shown in FIG. 1, the ceramic capacitor provided a capacitance of 1800 picofarads. This capacitance presents an actual measured value of approximately 40 ohm inductive impedance at 60 MHz. Again, 60 MHz is one of the frequencies close to an RF carrier in the low end of the VHF TV channels. Almost any amount of current flowing through this 40 ohm impedance will generate an appreciable potential with respect to system ground. When there are such currents flowing over the outer conductor of coaxial cable 40, the cable itself will act much like an antenna and will radiate RF energy. This phenomenon appears to be true whether the coaxial cable is terminated either in a 75 ohm unbalanced resistive load or terminated in a 300 ohm balanced resistive load via a 75 ohm-300 ohm balun transformer. These are, of course, the typical arrangements found at the back of modern TV receivers.

Figure 3:
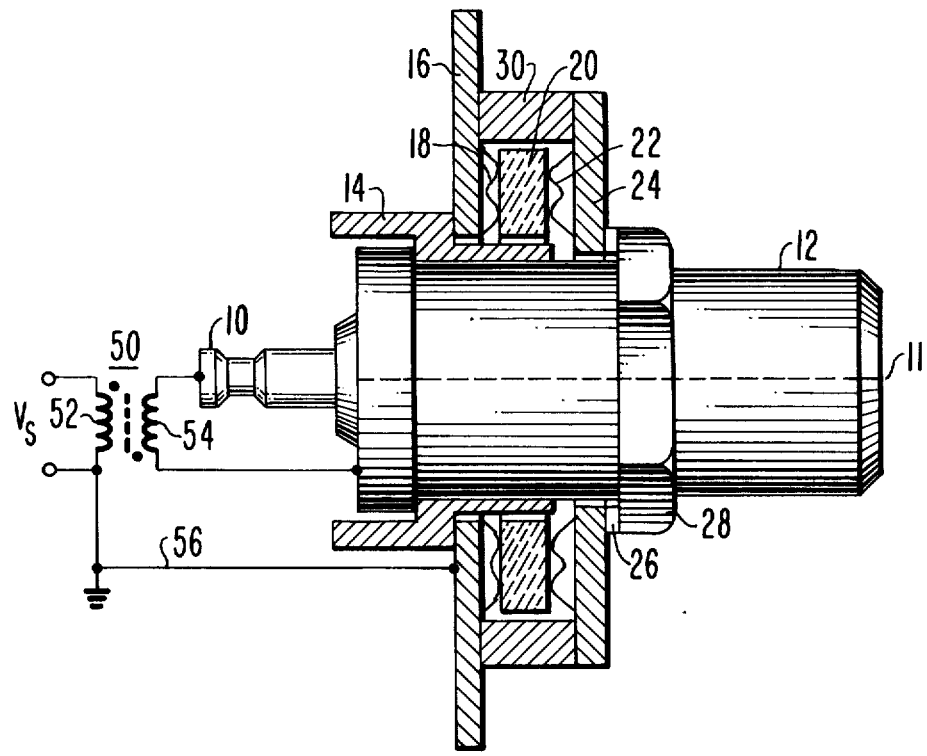
FIG. 3 is a sectional representation of a coaxial RF connector assembly having low frequency isolation as well as provision for RFI reduction.

FIG. 3 is a sectional representation of an RF connector assembly which incorporates the desirable features of low frequency and DC isolation while, in addition, makes provision for the reduction of radio frequency interference. In FIG. 3, the elements which are common to the connector shown in FIG. 2 are designated with the same numerals as previously described with respect to FIG. 2. The arrangement shown in FIG. 3 provides a transformer 50 having a primary winding 52 and a secondary winding 54. The primary winding and the secondary winding have an equal number of turns. That is, transformer 50 is such that it has a one-to-one turns ratio. Typically, the primary and the secondary windings are wound about a common toroidal core.

The primary winding 52 has two terminals which are connected across the source of RF signals $V_s$. One of the terminals of primary winding 52 is connected to a point of system ground potential on one side of the source $V_s$. The secondary winding 54 has two terminals, one of which is connected to the inner conductor 11 of the assembly via tab 10 and the other terminal of the secondary winding 54 is electrically connected to the outer conductor 12. The dot notation on the transformer 50 is reversed for reasons which will become evident herein. In addition, FIG. 3 shows an electrical connection between the point of system ground potential and one side of the chassis wall 16 via a conductor 56. This conductor 56 is merely meant to represent the fact that the conductive chassis wall 16 is at ground potential.

Figure 4:
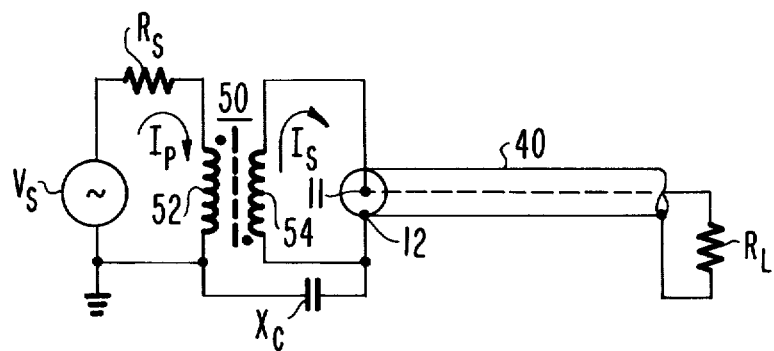
FIG. 4 is a schematic diagram of the equivalent circuit of the assembly of FIG. 3 when an RF coaxial cable and a load are connected to the assembly.

Referring now to FIG. 4 there is shown the equivalent circuit of the connector assembly shown in FIG. 3 when the RF cable 40 and the load $R_L$ are connected to the assembly. Again, the elements which are common to the previous figures have the same designations. In FIG. 4 it will be seen that the primary current $I_p$ flows through the primary winding 52 from $R_s$ to the point of system ground potential. The voltage developed across the primary winding 52 induces, as a result of the dot notation of the transformer 50, a voltage across the secondary winding 54 which causes the flow of current $I_s$ through the secondary winding 54. The current $I_s$ is coupled through the inner conductor 11 of the RF connector assembly and then through the inner conductor of the coaxial cable 40 to the load $R_L$. The shielded or outer conductor portion of coaxial cable 40 provides the return path for current back to the outer conductor 12 of the RF connector assembly. It will be seen that the ceramic capacitor 20 is now connected in such a way that it is used as a bypass to the system ground. The capacitance provided by the ceramic capacitor 20 is not an element in the load current signal path. Rather, the ceramic capacitor 20 now serves as a shielded type of bypass to maintain the shield of cable 40 at ground potential.

Under operating conditions, the RF currents flowing through the inner and outer conductor of the cable 40 will be approximately balanced and will therefore tend to cancel each other out and thus the cable 40 will not provide as much RF energy radiation as it might otherwise so provide.

When comparing the arrangements shown in FIG. 1 and FIG. 3, it will be noted that in FIG. 3 the RF source $V_s$ is no longer connected directly to the RF connector. Instead, the transformer 50 is connected in the assembly as an isolator. It is desirable to construct transformer 50 to be a wide band frequency device with low insertion loss characteristics plus high insulation qualities between the primary winding 52 and the secondary winding 54. In one practical design of transformer 50, a 0.5" diameter toroidal core having seven turns of teflon insulated wire on the primary winding and seven turns of the same wire wound on the secondary were used. With such a transformer design, an improvement of more than 15 db in the RF emission level from cable 40 was achieved as compared to the emission level of radiated RF energy in an arrangement which did not use transformer 50.

Thus, the RF connector assembly, as shown in FIG. 3, provides good coupling of RF signals from a source to a load while maintaining low frequency and DC isolation and additionally provides a means for reducing undesirable radio frequency interference.

What is claimed is:

1. An RF coaxial connector assembly having an inner conductor and an outer conductor and adapted for coupling signals from an RF source to a load, said assembly comprising:
   a transformer having a primary and a secondary winding, said transformer primary winding being adapted for connection to said RF source and said secondary winding being adapted for connection between the inner conductor and the outer conductor of said connector assembly; and
   means providing a capacitance electrically connected between said primary and said secondary windings, said capacitance means comprising a washer-like capacitor fitted over the outer conductor of said connector assembly.

2. The assembly according to claim 1 wherein said primary and secondary windings each comprise an equal number of turns on a common core.

3. The assembly according to claim 1 wherein said assembly is adapted for connection to a conductive wall of a utilization device.

4. An RF coaxial connector assembly having an inner conductor and an outer conductor, said assembly being adapted for coupling signals from an RF source to a load, said load being adapted for connection to said connector assembly via a shielded coaxial cable, said assembly comprising:
   a transformer having a primary and a secondary winding, each of said windings having first and second terminals, the first terminal of said primary winding being adapted for connection to said RF source, the second terminal of said primary winding being adapted for connected to a point of reference potential, the first terminal of said secondary winding being connected to said inner conductor, the second terminal of said secondary winding being connected to said outer conductor; and
   a means providing a capacitance electrically connected between the second terminal of said primary winding and the second terminal of said secondary winding, said second terminal of said secondary winding being, in addition, electrically connected to the shield of said coaxial cable when said cable is connected to said assembly, said capacitance means comprising a washer-like capacitor fitted over the outer conductor of said connector assembly.

5. The assembly according to claim 4 wherein said primary and said secondary windings each comprise an equal number of turns on a toroidal core.

6. The assembly according to claim 5 wherein said assembly is adapted for connection to a conductive wall of a utilization device.

7. The assembly according to claim 6 wherein said primary and said secondary windings each comprise n turns where n is a number less than 10.

* * * * *